United States Patent [19]

Nulman

[11] Patent Number: 5,698,989
[45] Date of Patent: Dec. 16, 1997

[54] FILM SHEET RESISTANCE MEASUREMENT

[75] Inventor: Jaim Nulman, Palo Alto, Calif.

[73] Assignee: Applied Materilas, Inc., Santa Clara, Calif.

[21] Appl. No.: 712,992

[22] Filed: Sep. 13, 1996

Related U.S. Application Data

[63] Continuation of Ser. No. 318,948, Oct. 6, 1994, abandoned.

[51] Int. Cl.⁶ ...................................................... G01N 27/04
[52] U.S. Cl. .......................... 324/719; 324/715; 324/158.1; 427/8
[58] Field of Search ................................. 324/713, 715, 324/716, 719, 158.1; 427/8, 9, 10

[56] References Cited

U.S. PATENT DOCUMENTS

| | | | |
|---|---|---|---|
| 3,970,923 | 7/1976 | Clark et al. | 324/719 |
| 4,207,137 | 6/1980 | Tretola | 324/719 X |
| 4,335,350 | 6/1982 | Chen | 324/719 X |
| 4,348,886 | 9/1982 | Faith, Jr. | 427/8 X |
| 4,440,799 | 4/1984 | Faith, Jr. | |
| 4,543,576 | 9/1985 | Hieber et al. | 427/8 X |
| 4,842,683 | 6/1989 | Cheng et al. | |
| 4,868,490 | 9/1989 | Blumenthal | 324/715 |
| 4,892,753 | 1/1990 | Wang et al. | |
| 5,103,182 | 4/1992 | Moslehi | 324/719 X |
| 5,184,398 | 2/1993 | Moslehi | 361/239 X |
| 5,400,209 | 3/1995 | Moslehi | 324/715 X |
| 5,442,297 | 8/1995 | Verkuil | 324/719 X |

FOREIGN PATENT DOCUMENTS

| | | |
|---|---|---|
| 0 581 703 A1 | 2/1994 | European Pat. Off. . |
| DE 41 32562 A1 | 4/1993 | Germany . |

OTHER PUBLICATIONS

IBM Corp., IBM Technical Disclosure Bulletin, "Application of Sheet Resistance Probe To Control of Chemical Vapor Deposition Process", IBM Corp. 1991, vol. 33, No. 9, Feb. 1991, pp. 426–427.

Jian LI, L.H. Allen and J.W. Mayer, Department of Materials Science and Engineering, Cornell University, Ithaca, NY 14853, USA, Elsevier Science Publishers V.B. (North-Holland Physics Publishing Division), Nuclear Instruments and Methods in Physics Research B36 (1989), "Ion Mixing Kinetics Study By In Situ Resistance Measurements In the Au/Si System", 2107B Nuclear Instrum. & Methods in Phys. Research/B 36 (1989) Feb. (I) No. 2, Amsterdam, NL, pp. 153–156.

*Primary Examiner*—Ernest F. Karlsen
*Assistant Examiner*—Diep Do
*Attorney, Agent, or Firm*—Patterson & Streets, L.L.P.

[57] ABSTRACT

Apparatus and methods for measuring the sheet resistance of an electrically conductive film on a semiconductor substrate while maintaining the substrate within the vacuum environment of the semiconductor process apparatus. In one aspect of the invention, the conductive film is deposited on the substrate within a vacuum chamber, and the resistance probe is located within the same chamber. The probe retracts out of the way during deposition of the film, and then moves to the substrate to measure the resistance of the film after deposition is paused or completed. In a second aspect of the invention, the probe is located in a chamber other than the chamber which deposits the conductive film. The chamber housing the probe can be the "transfer chamber" which houses the substrate transfer robot used to carry substrates from one process chamber to another, or it can be a cooling chamber which cools the substrate after the film is deposited so that the sheet resistance measurement can be performed at a desired lower temperature. If the probe is located in the transfer chamber, the probe can measure the substrate while it is in the transfer chamber in the course of being transferred from one process chamber to another.

31 Claims, 2 Drawing Sheets

FILM SHEET RESISTANCE MEASUREMENT

This is a continuation of application(s) Ser. No. 08/318,948 filed on Oct. 6, 1994, now abandoned.

BACKGROUND OF THE INVENTION

The present invention relates generally to semiconductor fabrication apparatus and methods. The invention relates more specifically to methods and apparatus for measuring the electrical sheet resistance of an electrically conductive film immediately after the deposition of the film on a semiconductor substrate.

During the fabrication of semiconductor devices, multiple film layers are deposited on a substrate. Preferably, the film layer should form a continuous coating of uniform thickness over the entire surface of the substrate. For example, a metal film layer may be used to cover a dielectric layer, wherein the dielectric layer includes holes or trenches extending therethrough. The metal film fills or conformally covers the holes or trenches in the dielectric layer to provide a conductive path through the dielectric layer to the layer or layers beneath the dielectric layer. After the metal film is deposited on the dielectric layer, it may then be masked and etched to form isolated metal interconnects on the substrate that extend above the base of any hole or trench by a height that approximately equals the sum of the thickness of the metal film deposited on the dielectric layer and the depth of the hole or trench. To ensure that the interconnects formed on the substrate have the desired electrical properties, the thickness of the metal film layer deposited on the substrate must be maintained within a specified tolerance band. If the metal film is too thick or too thin, the height, and thus the electrical resistance, of the interconnects created on the substrate will fall outside of the desired tolerance range. Likewise, if the thickness of the film layer is substantially non-uniform, the electrical resistance of a potion of the interconnects will fall outside of the desired tolerance range. In either case, the devices ultimately formed with the interconnects that fall outside of the tolerance range will be defective.

One method of monitoring the thickness of an eclectically conductive film deposited on a semiconductor substrate is to measure the electrical sheet resistance of the film. The bulk resistance of any desired material composition can be determined experimentally, and the bulk resistance of most materials deposited on semiconductor substrates is known. Therefore, the sheet resistance of a film of a known thickness and composition may be used as a baseline resistance value, and this baseline value can be compared to actual measured values of the sheet resistance of the film layer on the substrate, so as to monitor the thickness of the film layer. The resistance measurement is typically performed at multiple positions on the substrate, to enable the technician operating the process chamber to monitor variation in the thickness of the film layer from position to position on the substrate, or to monitor the variation in the film thickness from substrate to substrate.

Where the measured sheet resistance of the deposited layer differs substantially from the baseline sheet resistance value, i.e., it is outside of an acceptable tolerance range, this is an indication that the film layer is too thick or too thin. Where the sheet resistance measurements indicate that the variation in the thickness of the film layer deposited at various points on the substrate is too great, or that the film layer thickness is out of tolerance throughout the substrate, the technician will shut down the chamber for corrective maintenance.

Additionally, the film layer sheet resistance measurements may be used as an indicator of the trends occurring in the film deposition chamber. For example, where the measured sheet resistance continually changes but remains within the specified resistance tolerance band for the particular film layer, the technician may use the trend data for the film resistance value to adjust the chamber pressure, gas flow rate, power density, or other chamber process variables to maintain the film thickness within a specified tolerance band.

The sheet resistance of thin films is commonly measured with one of two different measuring apparatuses. A multi-point probe may be placed into contact with the film layer to measure the resistance of the film layer between the points, or a non-contacting eddy current probe may be placed in proximity with the substrate to measure the sheet resistance of the film layer. To measure the sheet resistance using either apparatus, the substrate must be removed from the processing chamber or a transfer chamber, and then manually placed into a jig or fixture in a separate, stand-alone, fixture to obtain the sheet resistance measurement. Based upon the sheet resistance value obtained for the film layer, in comparison with the tolerance band for the sheet resistance value and the prior sheet resistance values obtained from the same batch of substrates, a determination can be made as to whether any adjustments in the operating parameters of the chamber need to be made.

The conventional methodology for controlling the thickness of the film layer, i.e., by manually monitoring the sheet resistance of the film layer, has several drawbacks. First, the removal of a substrate from a chamber and placement of the substrate into a measuring jig or fixture is time consuming. During this time period, additional substrates will be processed which will incorporate the same film layer which may possibly be out of specification, or the chamber must be maintained in a non-processing mode while the sheet resistance of the film layer is determined. In either case, valuable processing time is wasted, and in the ease where additional substrates are processed while the sheet resistance measurement is being taken, the substrates may need to be destroyed if the measured film layer is out of specification. Additionally, manual handling of the substrate poses a risk of human handling errors which can contaminate or otherwise damage the substrate. Further, the chamber operator may manually enter correction factors into the chamber controller to change the chamber characteristics in response to changes in the film layer sheet resistance. This manual entry of the correction factors might include an error, which will result in an unacceptably thick or thin film layer on one or more substrates.

Additionally, many of the film layers deposited on a substrate quickly oxidize when exposed to air. When the substrate is removed from the process environment, rapid oxidation of the outermost surface of the film layer, which may occur when the film layer is exposed to the atmosphere, can also affect the validity of the measured value of the sheet resistance.

SUMMARY OF THE INVENTION

The present invention provides apparatus and methods for measuring the sheet resistance of an electrically conductive film on a semiconductor substrate using a conventional sheet resistance measuring probe, while maintaining the substrate within the vacuum environment of the semiconductor process apparatus.

In one aspect of the invention, the conductive film is deposited on the substrate within a vacuum chamber, and the resistance probe is located within the same chamber. The probe retracts out of the way during deposition of the film, and then moves to the substrate to measure the resistance of the film after deposition is paused or completed. Advantageously, this invention permits resistance measurements to be performed during the film deposition process, so that the process can be adjusted if necessary based on the absolute value or spatial uniformity of the resistance measurements.

In a second aspect of the invention, the probe is located in a chamber other than the chamber which deposits the conductive film on the substrate. The chamber housing the probe can be the transfer chamber which houses the substrate transfer robot used to carry substrates from one process chamber to another, advantageously avoiding the need for a separate chamber to house the probe. Alternatively, the probe can be housed in a separate chamber connected to the deposition chamber via a vacuum-tight transfer chamber so that the substrate can be maintained under vacuum when it is transferred from the deposition chamber to the resistance measuring chamber. Preferably, the chamber housing the probe has an apparatus for cooling the substrate before performing the resistance measurement, thereby permitting more accurate measurements than could he performed at the substrate temperatures required during film deposition.

The sheet resistance measurement results can, if desired, be used to automatically control the operating parameters of the deposition process to control the characteristics of the deposited film by adjusting process parameters including gas flow, electrical power, chamber pressure and deposition time.

The invention in any of the foregoing aspects advantageously avoids the measurement errors and risk of substrate damage inherent in conventional manual measurement systems.

DETAILED DESCRIPTION OF THE PREFERRED EMBODIMENTS

Figure 1:
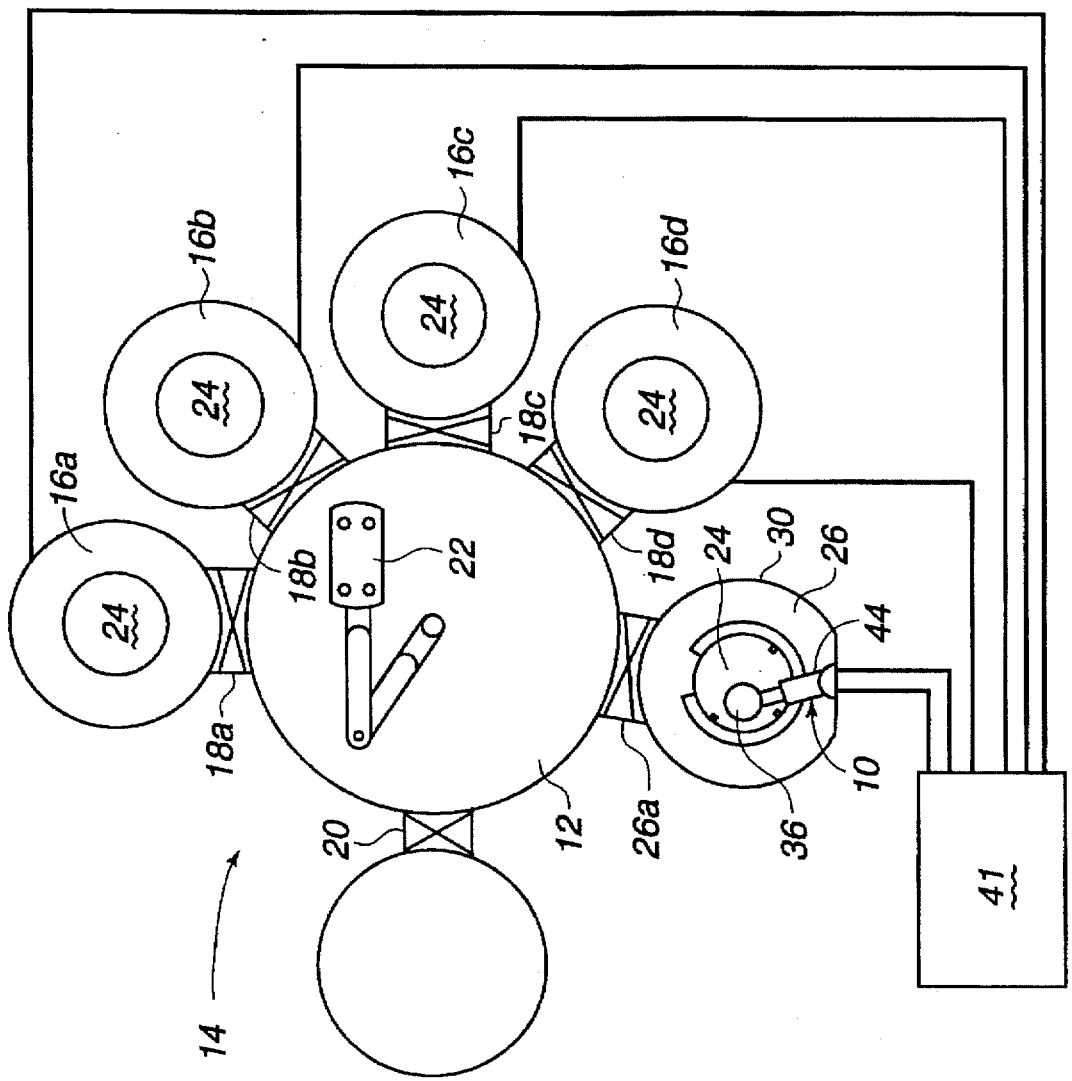
FIG. 1 is a top, sectional schematic view of a multiple chamber deposition apparatus incorporating the probe measuring apparatus of the present invention.

The present invention provides a sheet resistance measuring apparatus 10 located within a substrate processing apparatus to enable the measurement of the sheet resistance of a film layer deposited on a substrate without the need for intermediate manual handling of the substrate or removal of the substrate from the protection afforded by the processing apparatus. Referring to FIG. 1, one aspect of the invention is shown wherein a sheet resistance measuring device or probe 36 is located within a multiple chamber processing apparatus 14. The multiple chamber processing apparatus preferably includes a plurality of deposition chambers 16a–d, such as chambers in which PVD, CVD or other deposition process environments may be maintained, coupled to a substrate transfer chamber 12. Each deposition chamber 16a–d includes a slit valve 18a–d in communication with the transfer chamber 12. The transfer chamber 12 also includes an entry slit valve 20, for placement of substrates 24 into or out of the transfer chamber 12, and a robot arm 22 for moving the substrates 24 within the transfer chamber 12 and in and out of the deposition chambers 16a–d. Additionally, a cool down chamber 26 may be coupled to the transfer chamber 12, to receive the substrates 24 after the deposition of a film layer thereon in one of the process chambers 16a–d to allow the substrate 24 to cool from an elevated deposition chamber temperature to a temperature of not more than approximately 100° C. without removing the substrate 24 from the multiple chamber processing apparatus.

Figure 2:
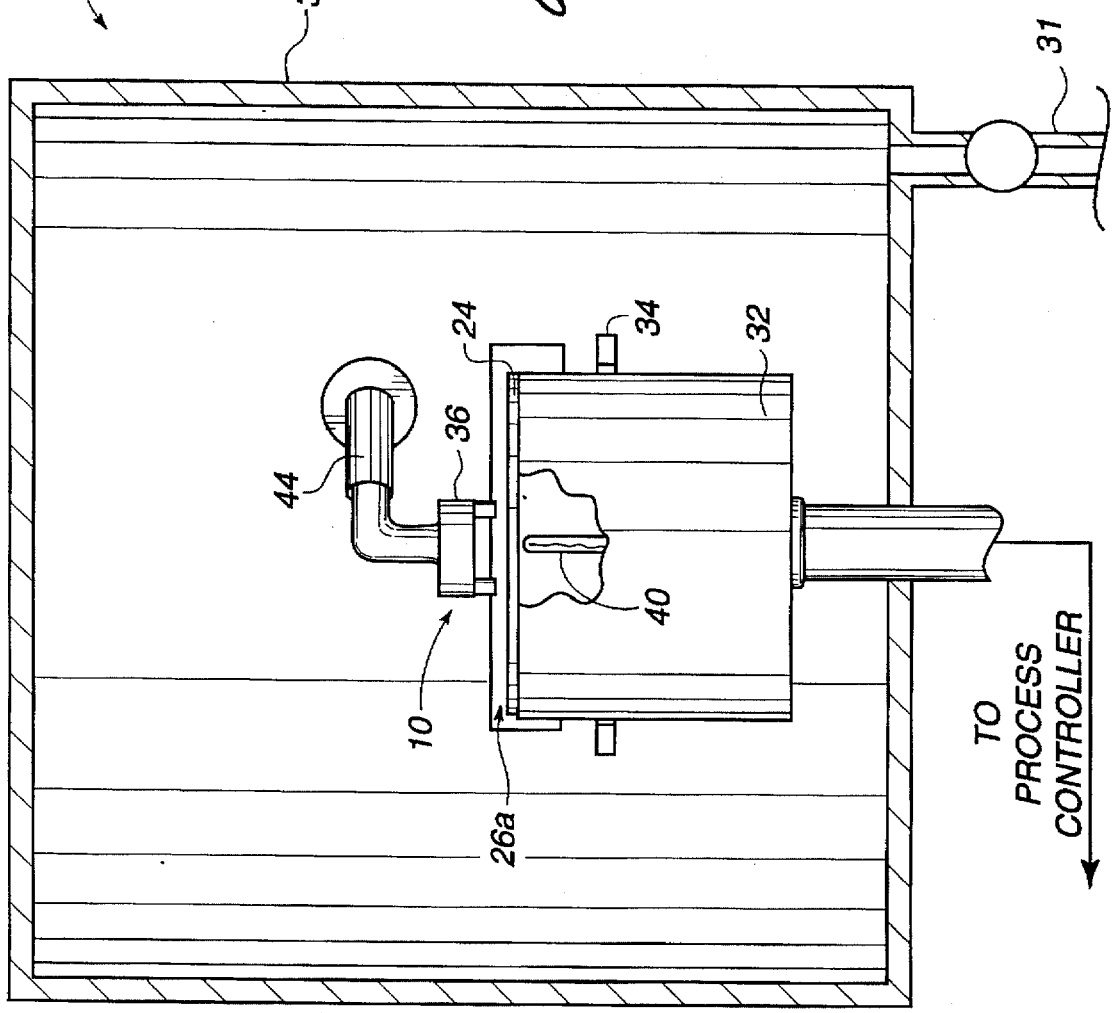
FIG. 2 is a sectional view of a probe of one of the chambers of FIG. 1, showing the probe and positioning of the probe with respect to the substrate.

Referring now to FIG. 2, the measuring probe 36 is preferably housed within a dedicated chamber which is preferably configured as a cool down chamber 26. The cool down chamber 26 includes an enclosure wall 30, a substrate receiving pedestal 32, a substrate support bracket 34 and the sheet resistance probe 36. One suitable arrangement for the substrate support bracket 34, and the interaction between the substrate support bracket 34, substrate receiving pedestal 32 and the robot arm to enable the placement of a substrate 24 on, and the removal of a substrate 24 from, the substrate support member 34 is shown in U.S. Pat. No. 4,892,753, the disclosure of which is incorporated herein by reference. In this configuration, the substrate receiving pedestal 32 is vertically moveable within the chamber 26 between a retracted position below the position of the substrate support bracket 34 and an extended position above the substrate support bracket 34. When the substrate receiving pedestal 32 is moved into its full upwardly extended position as shown in FIG. 2, it lifts the substrate 24 off the substrate support bracket 34 and positions the substrate 24 adjacent the sheet resistance probe 36 for measurement of the sheet resistance of the film layer deposited on the substrate 24. Other positioning means, such as retractable pins which extend upwardly from the pedestal 32 to allow a substrate 24 to be placed thereon or removed therefrom, and which retract into the pedestal 32 to position the substrate 24 on the pedestal 32, are specifically contemplated also.

The cool down chamber 26 is preferably configured as a vacuum chamber, wherein vacuum conditions may be maintained throughout the cooling of a substrate 24 to an acceptable measuring temperature. A non-reactive gas, such as the argon or other gas used as the sputtering process gas in the deposition chamber, may be added to the chamber at a partial pressure of up to 5 torr to improve heat conduction between the substrate and the pedestal. The cool down chamber 26 is also connected to the transfer chamber through a sealable slit valve 26a, and a vacuum pump (not shown) is connected to the chamber exhaust 31 to maintain a vacuum in the cool down chamber 26.

The substrate 24 is placed into the cool down chamber 26 immediately after the deposition of a film layer thereon in one of the deposition chambers 16a–d. Therefore, the temperature of the substrate 24 may be as high as 600° C. when it is removed from one of the process chambers 16a–d. As the substrate 24 is moved from one of the process chambers 16a–d, through the transfer chamber 12, and into the cool down chamber 26, its temperature will decrease. However, the temperature may still exceed 100° C. Therefore, the substrate 24 may be positioned on the substrate receiving pedestal 32 or on the transfer arm 34 for a period of time sufficient to allow it to cool to a desirable temperature of less than 100° C. The pedestal 32 is preferably cooled, such as by passing a coolant through a plurality of cooling channels (not shown) through the mass of the pedestal 32, and a gas may be flowed between the pedestal 32 and the substrate 24 to enable heat transfer between the substrate 24 and the pedestal 32 in the vacuum environment of the cool down chamber 26. One suitable arrangement of the cooling channels and gas cooling is shown in U.S. Pat. No. 4,842,683, Cheng, et al., the disclosure of which is incorporated herein by reference.

The film sheet resistance measurement, when performed with a non-contacting eddy current probe 36, should be performed at substrate temperatures below 100° C. To ensure that the substrate 24 has achieved this reduced temperature, a thermocouple 40 may be placed adjacent the substrate receiving surface of the pedestal 32 and in contact with the mass of the pedestal 32 to indirectly measure the temperature of the substrate 24 on the pedestal 32. Preferably, the output signal of this thermocouple 40 is transmitted to a process controller 41, and the process controller 41 is configured to control the placing of the substrate 24 and pedestal 32 in the cool down chamber 26 and to control the operation of the sheet resistance probe 36.

Referring still to FIG. 2, the sheet resistance probe 36 is preferably a non-contact eddy current probe. Such probes are commercially available from Prometrix of Santa Clara, Calif., and are sold under the designation "probing head." The probe 36 preferably is electrically connected to the process controller 41 for the multiple chamber processing apparatus 14, and will transmit a signal to the controller 41 indicating the sheet resistance of the film deposited on the substrate 24 in one or more of the process chambers 16a–d. The process controller 41 obtains position inputs from the wafer handling robot, and thus can identify the source chamber for the substrate 24 film layer being measured by the sheet resistance probe 36. Thus, once the sheet resistance value for the particular substrate 24 being evaluated is received in the process controller 41, the process controller 41 can be programmed to modify the process conditions in the appropriate one of chambers 16a–d to maintain the desired sheet resistance of the film deposited on subsequent substrates 24 therein, and the controller 41 can be programmed to shut down a particular chamber if the sheet resistance measurement is indicative of too great a variance in the uniformity of the film thickness layer.

Preferably, the sheet resistance of the film layer should be measured at multiple locations on the substrate 24 so as to determine the uniformity of thickness of the deposited film layer formed on the substrate 24. This may be accomplished with the probe 36 by moving the probe 36 to several locations on the substrate 24, or moving the support pedestal 32 under the probe 36, and measuring the sheet resistance at each of the locations. The probe 36 may be moved, with respect to the substrate 24, by providing the probe 36 at the end of a moveable telescoping robot arm 44 extending from the wall 30 of the cool down chamber 26. Alternatively, the probe 36, or the pedestal 32, may be configured with lead screws (not shown), or other mechanisms, to move the probe 36 in the plane of the substrate 24 to allow positioning the probe 36 over different points on the substrate.

The time required for a single, moveable probe 36 to sequentially measure the thickness of a film at several points may exceed the time required to deposit the film. If so, it will be impossible to measure every substrate without reducing production throughput. To overcome this problem, an alternative embodiment of the invention employs several probes (not shown) mounted in a single dedicated chamber, such as the cool down chamber 26, to enable simultaneous measurement of the sheet resistance at several locations on the substrate 24. Preferably five to nine probes should be used. Although a larger number of probes is desireable to increase the number of points on the substrate a which thickness uniformity can be measured, the number of probes is limited by the cost of the probes and the available space in the chamber 26 in which the probes are mounted.

Although the sheet resistance probe has been described herein in terms of a non-contacting type of probe such as an eddy current probe, the invention is equally suited to the use of a contacting type of sheet resistance probe which measures resistance directly. Using a contact type probe may eliminate the need to cool the pedestal 32, because contact type probes typically provide accurate measurements a higher temperatures than eddy current probes.

Instead of positioning the probe 36 in a post-deposition cool-down chamber 26 as described above, the probe can be mounted within one of the film deposition chambers 16a–d. Preferably, the chamber includes a shield, and the probe can be moved behind the shield during deposition to prevent any material from being deposited on the probe. After a film has been deposited on a substrate, the probe is moved away from the shield and into a position immediately over the substrate. The mechanism for moving the probe over the substrate can be the same as the robot arm 44 of the previously described cool-down chamber embodiment of FIG. 2. Optionally, the shield is also moveable, so that it is positioned to cover the probe during film deposition, and it is retracted away from the probe during the subsequent step of measuring the sheet resistance of the film after deposition is halted.

In another alternative embodiment, the substrate 24 need not be placed on a pedestal 32 during measurement of the sheet resistance. Instead, the sheet resistance measurement may be taken while the substrate 24 is supported on the robot arm 22, on a wafer handling apparatus such as the transfer arm 34, or on another chamber component.

The film sheet resistance measurements enabled by the present invention allow for automatic control of the chamber environment to ensure that the chamber provides a consistent thickness deposition on each substrate 24, and from substrate 24 to substrate 24. Where the sheet resistance at different locations of the substrate 24 is acceptably uniform, but is too high, or the trend in the sheet resistance measurement indicates that the sheet resistance value is getting higher as each substrate 24 is processed, the chamber process controller 41 will increase the plasma power density (where the chambers 16a–d are sputtering chambers) and/or the deposition time to provide a thicker deposition layer on the next substrate 24 being processed in the chamber. Likewise, if the sheet resistance value is too low, or the trend of the sheet resistance measurement indicates that the sheet resistance is decreasing as each substrate 24 is processed through the chamber, the chamber process controller 41 will decrease the plasma power density (where the chambers 16a–d are sputtering chambers) and/or the process time to decrease the thickness of the deposition layer formed on the next substrate 24 processed in the chamber. If the sheet resistance of the film layer changes significantly from on wafer to the next, or the sheet resistance measurement from position to position on the substrate 24 becomes non-uniform, the chamber process controller 41 will shut the chamber down and preferably provide a visual or audible indication that chamber maintenance is necessary.

The present invention thus provides a sheet resistance measuring system by which the sheet resistance of a deposited film layer may be measured immediately after the film layer is deposited on the substrate 24, without exposure of the film layer to air or other non-chamber environment contaminants. Additionally, where a eddy current measuring probe 26 is used to provide the resistance measurement, the thermocouple 40 and the process controller 41 may be used to monitor the temperature of the substrate 24, and thereby ensure that the film layer resistance measurement is performed at an acceptable temperature. Finally, by coupling the measurement of the sheet resistance value to the chamber process controller 41, the controller 41 may automatically change the chamber process conditions and thereby eliminate a possibly erroneous manual correction factor input by an operator.

I claim:

1. An apparatus for monitoring the sheet resistance of films on a substrate surface, comprising:
   a vacuum chamber that is in communication with a deposition chamber in which the film is deposited, wherein the vacuum chamber has means for cooling the film;
   a substrate support disposed within said vacuum chamber for providing a support surface for a substrate with a film formed thereon; and
   a sheet resistance measurement member disposed within said vacuum chamber and positionable adjacent the film containing surface of the substrate to measure the sheet resistance of the film when the substrate is located on said substrate support.

2. The apparatus of claim 1, further comprising a deposition chamber connected directly to said vacuum chamber; and
   a substrate handling member for moving a substrate from said deposition chamber to said vacuum chamber.

3. The apparatus of claim 2, wherein:
   said substrate support is a support pedestal.

4. The apparatus of claim 1, wherein said vacuum chamber is a substrate cooling chamber.

5. The apparatus of claim 4, wherein said substrate support is a substrate handling member for moving a substrate from said deposition chamber to said cooldown chamber.

6. The apparatus of claim 1, wherein said sheet resistance measurement member is an eddy current probe.

7. The apparatus of claim 1, wherein said sheet resistance measurement member is a multiple contact probe.

8. The apparatus of claim 1, wherein the sheet resistance measurement member includes multiple independent probes.

9. The apparatus of claim 1, wherein said vacuum chamber is a transfer chamber.

10. The apparatus of claim 1, wherein said vacuum chamber is a transfer chamber of a cluster tool.

11. The apparatus of claim 1 wherein the vacuum chamber is a processing chamber, and wherein the apparatus further comprises means for shielding the sheet resistance measurement member from a process environment maintainable is said processing chamber.

12. The apparatus of claim 1, wherein the substrate support and the sheet resistance measurement member are disposed on opposing sides of the substrate.

13. The apparatus of claim 1, wherein the sheet resistance measurement member comprises an arm that is positionable at various positions across the film.

14. A method of monitoring the sheet resistance of a film deposited on a substrate surface in a deposition chamber after completion of a film deposition step, comprising the steps of:
   providing a vacuum enclosure in communication with the deposition chamber;
   providing a support member in the vacuum enclosure;
   transferring a substrate from the deposition chamber to the support member;
   providing a sheet resistance measurement member in the enclosure adjacent the film containing surface of the substrate; and
   measuring the sheet resistance of the film layer on the substrate with the sheet resistance measurement member.

15. The method of claim 14, wherein the sheet resistance measurement member is an eddy current probe.

16. The method of claim 14, wherein the sheet resistance measurement member is a contacting probe.

17. The method of claim 14, wherein said sheet resistance measurement member includes multiple probes.

18. The method of claim 14, wherein the enclosure is a cooling chamber.

19. The method of claim 14, wherein the enclosure is a transfer chamber.

20. The method of claim 14 further comprising the step of:
   determining the thickness of the film from the sheet resistance.

21. A method of monitoring the thickness of a film deposited on a substrate surface in a substrate processing chamber, comprising the steps of:
   depositing a film on the substrate surface in the processing chamber;
   providing a sheet resistance measurement member in a sealable chamber;
   transferring the substrate from the processing chamber to the sealable chamber; positioning the film containing surface of the substrate adjacent to the sheet resistance measurement member; and
   measuring the sheet resistance of the film with the sheet resistance member.

22. The method of claim 21, including the further steps of:
   providing a process controller;
   controlling the process environment in the substrate processing chamber with the process controller; and
   automatically inputting the sheet resistance measurement of the film layer into the process controller.

23. The method of claim 22, including the further steps of:
   comparing the sheet resistance value obtained by measuring the sheet resistance of the film layer on the substrate with a baseline value of the sheet resistance with the process controller; and
   adjusting the process parameters in the process chamber to adjust the film thickness of the deposited film layer in response to the sheet resistance value of the deposited film as compared to the baseline value.

24. The method of claim 23, further including the step of measuring the sheet resistance of the film layer at multiple positions on the substrate.

25. The method of claim 24, wherein the sheet resistance measurement member includes multiple independent probes.

26. The method of claim 21, wherein the substrate processing chamber operates at a vacuum, and wherein the substrate is transferred from the processing chamber to the sealable chamber without breaking the vacuum.

27. The method of claim 21 further comprising the step of:
   determining the thickness of the film from the sheet resistance.

28. The method of claim 21, further comprising the steps of:
   moving the sheet resistance measurement member to another position on the film; and
   remeasuring the sheet resistance of the film.

29. An apparatus for in-situ measurement of film sheet resistance in a vacuum chamber, comprising:
   a substrate support disposed within the vacuum chamber for providing a support surface for a substrate having a surface with a film formed thereon; and a sheet resistance measurement member disposed within said vacuum chamber and positionable adjacent the film containing surface of the substrate to measure the sheet resistance of the film when the substrate is located on said substrate support.

30. A method of monitoring the thickness of conductive films formed on substrates in a deposition chamber, comprising the steps of:

(a) providing a sheet resistance measurement member;

(b) transferring a first substrate having a surface with a conductive film formed thereon from the deposition chamber to a position with the film containing surface adjacent to the sheet resistance measurement member;

(c) measuring the sheet resistance of the film with the sheet resistance member;

(d) comparing the sheet resistance of the film with a baseline sheet resistance value representing a known film thickness; and (e) adjusting the process parameters in the deposition chamber to provide a desired film thickness on a second substrate.

31. The method of claim 30 further comprising the step of repeating steps (b) through (e).

* * * * *